United States Patent
Bot et al.

(10) Patent No.: US 10,664,644 B1
(45) Date of Patent: May 26, 2020

(54) METHOD AND APPARATUS FOR SCHEMATIC VERIFICATION OF ELECTRONIC CIRCUITS

(71) Applicant: BQR Reliability Engineering Ltd., Rishon-Lezion (IL)

(72) Inventors: Yizhak Bot, Rishon-Lezion (IL); Alex Gonorovsky, Rishon-Lezion (IL); Isaac Rosenstein, Rishon-Lezion (IL)

(73) Assignee: BQR RELIABILITY ENGINEERING LTD., Rishon-Lezion (IL)

(*) Notice: Subject to any disclaimer, the term of this patent is extended or adjusted under 35 U.S.C. 154(b) by 0 days.

(21) Appl. No.: 16/217,355

(22) Filed: Dec. 12, 2018

(51) Int. Cl.
*G06F 30/00* (2020.01)
*G06F 30/398* (2020.01)
*G01R 31/319* (2006.01)

(52) U.S. Cl.
CPC ..... *G06F 30/398* (2020.01); *G01R 31/31917* (2013.01)

(58) Field of Classification Search
CPC .......................... G06F 30/398; G01R 31/31917
See application file for complete search history.

(56) References Cited

U.S. PATENT DOCUMENTS

| | | | |
|---|---|---|---|
| 5,461,573 A * | 10/1995 | Chakradhar | G01R 31/31839 716/103 |
| 6,230,305 B1 | 5/2001 | Meares | |
| 6,360,353 B1 | 3/2002 | Pember et al. | |
| 6,851,094 B1 | 2/2005 | Robertson et al. | |
| 6,877,033 B1 | 4/2005 | Garrett et al. | |
| 6,941,243 B1 * | 9/2005 | Maciona | G06F 11/263 702/117 |
| 7,143,023 B2 | 11/2006 | Katz et al. | |
| 7,228,514 B2 | 6/2007 | Chan et al. | |
| 7,281,232 B1 * | 10/2007 | Nicolino, Jr. | G06F 30/398 716/112 |
| 7,386,823 B2 * | 6/2008 | Tsai | G06F 30/30 716/102 |
| 7,464,348 B1 * | 12/2008 | Lockman | G06F 30/394 716/132 |
| 8,650,515 B2 | 2/2014 | Alam et al. | |
| 8,832,612 B1 | 9/2014 | O'Riordan et al. | |
| 10,346,581 B2 * | 7/2019 | Kerr | G06F 30/392 |
| 10,534,879 B2 * | 1/2020 | Baker | G06F 30/367 |

(Continued)

*Primary Examiner* — Naum Levin
(74) *Attorney, Agent, or Firm* — The Roy Gross Law Firm, LLC; Roy Gross (57) ABSTRACT

A method, system and computer program product, the method comprising: obtaining circuit information of at least a portion of a circuit design, the circuit information specifying a plurality of components and a plurality of connecting elements connecting components from the plurality of components; receiving a plurality of rule definitions, each rule definition verifying an interaction between one or more first objects and one or more second objects, via one or more connecting elements; obtaining a plurality of specific rules generated upon the plurality of rule definitions; verifying the specific rules against the circuit information, thereby checking that the first objects have the interaction with the second objects via the one or more connecting elements; and outputting results of verifying the specific rules.

20 Claims, 6 Drawing Sheets

(56) References Cited

U.S. PATENT DOCUMENTS

| | | | |
|---|---|---|---|
| 2009/0105983 A1* | 4/2009 | Variyam | G01R 31/319 |
| | | | 702/124 |
| 2010/0306720 A1* | 12/2010 | Pikus | G06F 30/398 |
| | | | 716/106 |
| 2013/0047133 A1 | 2/2013 | Alam et al. | |
| 2013/0205268 A1 | 8/2013 | Monroe et al. | |
| 2017/0249410 A1* | 8/2017 | Baker | G06F 30/00 |

* cited by examiner

| # | RULE | | FIRST OBJECT | | SECOND OBJECT | | CONNECTING ELEMENT | | | VERIFY | SEV. |
|---|---|---|---|---|---|---|---|---|---|---|---|
| | GROUP | # | TYPE | REG. EXP. | TYPE | REG. EXP. | TYPE | MIN. VAL. | MAX. VAL. | | |
| 1 | USB_D+/- | 2 | NET | .{0,}D\+1.{0,} | PIN NAME | .{0,}D\+1.{0,} | RES. (OHM) | - | - | CONN. | MAJ. |
| 2 | USB_D+/- | 4 | PIN NAME | .{0,}D\-1.{0,} | PIN NAME | .{0,}D\-1.{0,} | SHORT CONN. | - | - | CONN. | MAJ. |
| 3 | UART_TX/RX | 1 | PIN NAME | .{0,}TX.{0,} | PIN NAME | .{0,}TX.{0,} | SHORT CONN. | - | - | CONN. | MIN. |
| 4 | UART_TX/RX | 4 | PIN NAME | .{0,}RX.{0,} | PIN NAME | .{0,}RX.{0,} | SHORT CONN. | - | - | CONN. | MIN. |
| 5 | I2C | 3 | PIN NAME | .{0,}SCL.{0,} | PIN NAME | .{0,}SCL.{0,} | SHORT CONN. | - | - | CONN. | MAJ. |
| 1 | BQR_I2C_PULLUP | 2 | NET | .{0,}I2C.{0,}_[SDA\|SCL\|CLK].{0,} | NET | .{0,}VDD.{0,} | RES. (OHM) | 1000 | 100000 | CONN. | MAJ. |
| 6 | UART_TX/RX | 4 | NET | .{0,}TX.{0,} | PIN NAME | .{0,}TX.{0,} | SHORT CONN. | - | - | NOT CONN. | MAJ. |

| LIST OF MATCHED OBJECTS | | | |
|---|---|---|---|
| REGULAR EXPRESSION | .{0,}I2C.{0,}_[SDA\|SCL\|CLK].{0,} | | |
| | NET NAME | REF. DES. | PIN # |
| 1 | MCU1_I2C_SCL_MCU2_I2C_S | MCU1_U1 | 42 |
| 2 | MCU1_I2C_SDA_MCU2_I2C_S | MCU1_U1 | 42 |
| 3 | MCU1_I2C_SDA_MCU2_I2C_S | MCU2_U1 | 43 |
| 4 | MCU1_I2C_SCL_MCU2_I2C_S | MCU2_U1 | 43 |

| GROUP NAME | RefDes | PIN NUMBER | PIN NAME | NET NAME |
|---|---|---|---|---|
| AA0 | U13 | D21 | ddr0_ca_a[0]#7v1 | DDR0_LP4_CA0_A |
|  |  | A26 | ddr0_ca_a[1]#7v1 | DDR0_LP4_CA1_A |
|  |  | A22 | ddr0_ca_a[2]#7v1 | DDR0_LP4_CA2_A |
|  |  | B21 | ddr0_ca_a[3]#7v1 | DDR0_LP4_CA3_A |
| AA1-AA5 | U13 | B25 | ddr0_ca_a[4]#7v1 | DDR0_LP4_CA4_A |
|  |  | A24 | ddr0_ca_a[5]#7v1 | DDR0_LP4_CA5_A |

FIG. 3B 384    388  392

| RULE ID | FIRST GROUP | SECOND GROUP | VERIFY | IF TRUE GO TO | IF FALSE GO TO |
|---|---|---|---|---|---|
| AA0 TO BB0 | AA0 | BB0 | CONN. | BUS AA(1-5) TO BUS BB(1-5) | AA0 TO CC0 |
| AA0 TO CC0 | AA0 | CC0 | CONN. | BUS AA(1-5) TO BUS CC(1-5) | FINAL FALSE |
| BUS AA(1-5) TO BUS BB(1-5) | AA1-AA5 | BB1-BB5 | CONN. | DD0 TO EE0 | FINAL FALSE |
| BUS AA(1-5) TO BUS CC(1-5) | AA1-AA5 | CC1-CC5 | CONN. | DD0 TO JJ0 | FINAL FALSE |
| BUS FF(0-7) TO BUS GG(0-7) | FF0-FF7 | GG0-GG7 | CONN. | FINAL TRUE | FINAL FALSE |
| BUS FF(0-7) TO BUS HH(0-7) | FF0-FF7 | HH0-HH7 | CONN. | FINAL TRUE | FINAL FALSE |
| BUS FF(0-7) TO BUS KK(0-7) | FF0-FF7 | KK0-KK7 | CONN. | FINAL TRUE | FINAL FALSE |
| BUS FF(0-7) TO BUS LL(0-7) | FF0-FF7 | LL0-LL7 | CONN. | FINAL TRUE | FINAL FALSE |
| DD0 TO EE0 | DD0 | EE0 | CONN. | BUS FF(0-7) TO BUS GG(0-7) | BUS FF(0-7) TO BUS HH(0-7) |
| DD0 TO JJ0 | DD0 | JJ0 | CONN. | BUS FF(0-7) TO BUS KK(0-7) | BUS FF(0-7) TO BUS LL(0-7) |

METHOD AND APPARATUS FOR SCHEMATIC VERIFICATION OF ELECTRONIC CIRCUITS

TECHNICAL FIELD

The present disclosure relates to schematic verification of electronic circuits in general, and to a method and apparatus for testing connectivity in electronic circuit designs, in particular.

BACKGROUND OF THE INVENTION

Computerized devices, comprising hardware and software, control almost every aspect of our life—from writing documents to controlling traffic lights. However, computerized systems are bug-prone, and thus require a testing phase in which the bugs should be discovered. The testing phase is considered one of the most difficult tasks in designing a computerized device. The cost of not discovering a bug may be enormous, as the consequences of the bug may be disastrous. For example, a bug may cause the injury of a person relying on the designated behavior of the computerized system.

Generally speaking, the earlier bugs are found, the cheaper and easier it is to fix them and the lower is their cost. For example, a problem in a manufactured hardware or firmware of a product may be due to a design flaw or to manufacturing flow. If the problem is due to design flaw, this necessitates fixing or discarding all manufactured units, and is thus extremely expensive.

Thus, catching problems during the design of a device is highly beneficial. Hence, many developers of computerized systems and in particular electronic circuits invest a substantial portion of the development cycle in discovering and solving problems.

Of particular interest are connectivity problems within an integrated circuit. A typical circuit comprises thousands or more components, each connected to one or more other components. Defining and verifying the required connectivity between the components within a circuit design is thus a problematic task, which if not performed correctly may lead to incorrect and possibly harmful design and hence functionality of the circuit.

SUMMARY OF THE INVENTION

One exemplary embodiment of the disclosed subject matter is a computer-implemented method comprising: obtaining circuit information of at least a portion of a circuit design, the circuit information specifying a plurality of components and a plurality of connecting elements connecting components from the plurality of components; receiving a plurality of rule definitions, each rule definition verifying an interaction between one or more first objects and one or more second objects, via one or more connecting elements; obtaining a plurality of specific rules generated upon the plurality of the rule definitions; verifying the specific rules against the circuit information, thereby checking that the first objects have the interaction with the second objects via the one or more connecting elements; and outputting results of verifying the specific rules. Within the method, within a rule of the plurality of rules, a first object optionally comprises two or more components from the plurality of components, or a second object optionally comprises two or more components from the plurality of components, or the connecting element comprises two or more connecting elements from the plurality of connecting elements. The method can further comprise obtaining, by the computing device, model data associated with a component of the plurality of components or a connecting element of the plurality of connecting elements. Within the method, a first object or a second object optionally includes an electronic component pin or a network. Within the method, each of the electric component pins is optionally specified by a characteristic selected from the group consisting of: a pin name; a pin type; and a pin number. Within the method, the first object or the second object or the connecting element is optionally defined by a common expression. Within the method, the common expression is optionally a regular expression. Within the method, the interaction between the first object and the second object is optionally selected from the group consisting of connected or not connected. Within the method, the connecting element optionally comprises a plurality of connecting elements. Within the method, the plurality of rule definitions optionally comprises a sequence of rules such that one or more rules are to be performed subject to specific results of preceding rules, and an end result of the sequence of rules depends on results of the one or more rules and the preceding rules.

Another exemplary embodiment of the disclosed subject matter is a system having a processor, the processor being adapted to perform the steps of: obtaining circuit information of at least a portion of a circuit design, the circuit information specifying a plurality of components and a plurality of connecting elements connecting components from the plurality of components; receiving a plurality of rule definitions, each rule definition verifying an interaction between one or more first objects and one or more second objects, via one or more connecting elements; obtaining a plurality of specific rules generated upon the plurality of the rule definitions; verifying the specific rules against the circuit information, thereby checking that the first objects have the interaction with the second objects via the one or more connecting elements; and outputting results of verifying the specific rules. Within the apparatus, in a rule of the plurality of rules the first object optionally comprises two or more components from the plurality of components, or the second object optionally comprises two or more components from the plurality of components, or the connecting element optionally comprises two or more connecting elements from the plurality of connecting elements. Within the apparatus, the processor is optionally further configured to obtain model data associated with a component of the plurality of components or a connecting element of the plurality of connecting elements. Within the apparatus, the first object or the second object optionally includes an electronic component pin or a network. Within the apparatus, each of the electric component pins is optionally specified by a characteristic selected from the group consisting of: a pin name; a pin type; and a pin number. Within the apparatus, the first object or the second object or the connecting element is optionally defined by a common expression being a regular expression. Within the apparatus, the interaction between the first object and the second object is optionally selected from the group consisting of connected or not connected. Within the apparatus, the connecting element optionally comprises a plurality of connecting elements. Within the apparatus, the plurality of rule definitions, optionally comprises a sequence of rules such that a rule is to be performed subject to specific results of preceding rules, and an end result of the sequence of rules depends on results of the rule and the preceding rules.

Yet another exemplary embodiment of the disclosed subject matter is a computer program product comprising a non-transitory computer readable medium retaining program instructions, which instructions when read by a processor, cause the processor to perform a method comprising: obtaining circuit information of at least a portion of a circuit design, the circuit information specifying a plurality of components and a plurality of connecting elements connecting components from the plurality of components; receiving a plurality of rule definitions, each rule definition verifying an interaction between one or more first objects and one or more second objects, via one or more connecting elements; obtaining a plurality of specific rules generated upon the plurality of the rule definitions; verifying the specific rules against the circuit information, thereby checking that the first objects have the interaction with the second objects via the one or more connecting elements; and outputting results of verifying the specific rules.

BRIEF DESCRIPTION OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION OF THE INVENTION

The term "Net" used in this specification should be expansively construed to cover any kind of Net, i.e., a node from a netlist describing an electronic circuit. A Net is typically described by at least a name (NetName) and the elements connected by the Net.

The term "PinType" used in this specification should be expansively construed to cover any type of pin in an electronic circuit, e.g. input, output, open drain, or the like.

The term "PinName" used in this specification should be expansively construed to cover any string representing a name of a pin, a name of a signal going through a pin, or the like.

The term "Object" used in this specification should be expansively construed to cover any kind of object within an integrated circuit (IC) which can be connected to another object. Exemplary Objects include but are not limited to: a NetName, a PinType, a PinName or a DifferNet defined below. An Object may be defined by a type, and a string indicating a name or another identifier.

The term "Connecting Element" used in this specification should be expansively construed to cover any component having two or more connection points to which two or more Objects can connect. Exemplary Connecting Elements include but are not limited to a resistor, an extern resistor, an intern resistor, a capacitor, an extern capacitor, an intern capacitor, a coil, or a short connection. The prefix "extern" indicates a stand-alone component, while the prefix "intern" indicates a component included in an IC. A connecting element of type "Short Connection" indicates that two objects should be connected (or not) directly. A Connecting Element (excluding "Short Connection" type) may be defined by required ranges for one or more parameters, e.g. minimum and maximum values, for example the resistance of a resistor.

Additionally, it may be defined that two elements are not connected to each other.

Testing and verification is an important part of the development of any new product. Testing can and should be integrated with any stage of the development, and in particular with the design.

In electronic circuits, complex circuit functionality is provided by interconnecting a plurality of components together in various manners. Thus, a highly important and complex part of the schematic verification process is a connectivity verification of different components (on pin level).

Thus, one technical problem dealt with by the disclosed subject matter is the need to perform schematic verification of an electronic circuit, and in particular connectivity verification of the connection between different elements, for example on pin level.

Schematic verification requires the generation of rules for testing all the required connectivities, such that these rules may then be verified on the IC design.

Another technical problem relates to rules indicating the connectivity between two Objects via a Connecting Element as defined above, which may include a short connection, connection through a Connecting Element, or no connection.

Yet another technical problem relates to some rules testing the connectivity within similar or identical combinations of Objects through a Connecting Element, in various locations over the electronic circuit. Repeating the rule definitions over and over is a tedious and error-prone process which may result in omission of one or more rules which may lead to incomplete testing of the design.

Thus, one technical solution provided by the disclosure is a method and apparatus for a user to define rules, each rule related to the connectivity between a first Object and a second Object through a Connecting Element. A rule may be defined by receiving a user selection of a first Object from a list of objects in the circuit, or otherwise entering the first Object, a user selection of a second Object from a list of objects in the circuit, or otherwise entering the second Object, and selection of a Connecting Element. The user may further define one or more parameters for the Connecting Element. In some embodiments, the user may define a plurality of options for the Connecting Element. For example, a first Object may be connected to a second object through a Short Connection or through a resistor. The user may select an interaction for the rule, indicating connection or no connection, i.e., whether the first and second Objects are required to be connected or disconnected.

In some embodiments, a user may define any of the first Object or the second Object not as a specific named instance of an Object, but rather as two or more Objects, specified for example as a regular expression. Thus, a plurality of rules may be generated upon a single definition, for verifying that each instance of Objects complying with the regular expression for the first Object is connected to a corresponding second Object complying with the definition or regular expression for the second Object through a Connecting Element. In some embodiments, the connecting Element may also be defined using a regular expression.

Once all rule definitions are received from a user, one or more rules can be generated, for verifying the connectivity between a specific instance of the first Object and a specific instance of the second Object, through the Connecting Element. For example, if the First Object (and optionally also the second Object) are defined by regular expressions with which multiple Objects comply, then a rule may be defined for each possible combination of the first Object and the second Object within the circuit. If multiple options are provided for the Connecting Element, multiple rules may be defined with an OR relationship, such that the design needs to comply with one of the rules. If the first Object or the second Object is defined by its type only, then a rule may be generated for all first or second Objects of the respective type.

It will be appreciated that in some embodiments the connecting element can comprise a multiplicity of connecting elements, for example, two or more resistors, capacitors, or the like.

Once the electrical circuit is manufactured, the defined rules may be used for testing the actual connectivity of a manufactured unit, rather than the design.

One technical effect of the disclosure relates to a comprehensive solution for a user to define connectivity rules for verifying connectivity within a circuit design, wherein connectivity may relate but is not limited to a Short Connection, but can also be via any relevant component.

Another technical effect of the disclosure relates to a solution for a user to define one generic rule which may then be used for generating a plurality of specific rules verifying connectivity between specific Objects. The plurality of specific rules may then be verified independently, thus providing for example the discovery of flaw in the design in one area of the circuit, while other areas are fine.

Yet another technical effect of the disclosure relates to automatic verification of the connectivity rules and outputting the results, such that a user can review the results, and fix the connectivity issues.

The disclosed subject matter may provide for one or more technical improvements over any pre-existing technique and any technique that has previously become routine or conventional in the art.

Additional technical problems, solution and effects may be apparent to a person of ordinary skill in the art in view of the present disclosure.

Figure 1:
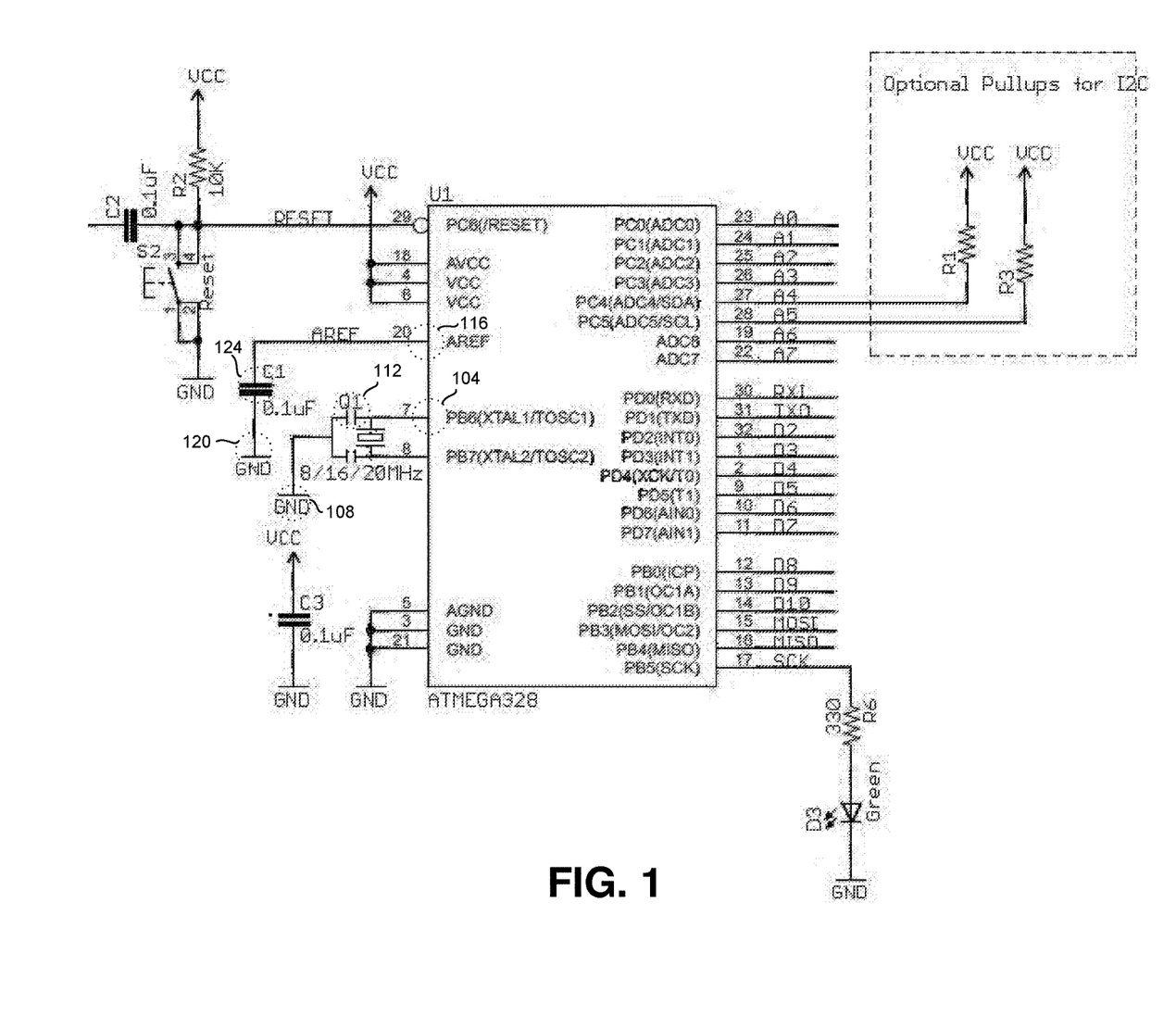
FIG. 1 shows an exemplary electronic circuit in which it is required to verify connectivity, in accordance with some exemplary embodiments of the disclosed subject matter.

Referring now to FIG. 1, showing an exemplary electrical circuit, for which connectivity rules are to be defined and verified. A first exemplary connectivity rule may be defined for verifying that pin 104 (named XTAL1) connects to Net 108 (GND) via a capacitor of min 4 pF and max 21 pF (in this case this may be capacitor 112 but its capacity is not provided, thus the rule may not be verified), and that Net 116 (AREF) connects to Net 120 (GND) also via a capacitor of min 0.047 uF and max 0.47 uF (in this case capacitor 124).

Once a rule is defined, it may be parsed in accordance with the net list and the bill of material (BOM) of the circuit, and the two rules may be generated and verified.

Figure 2:
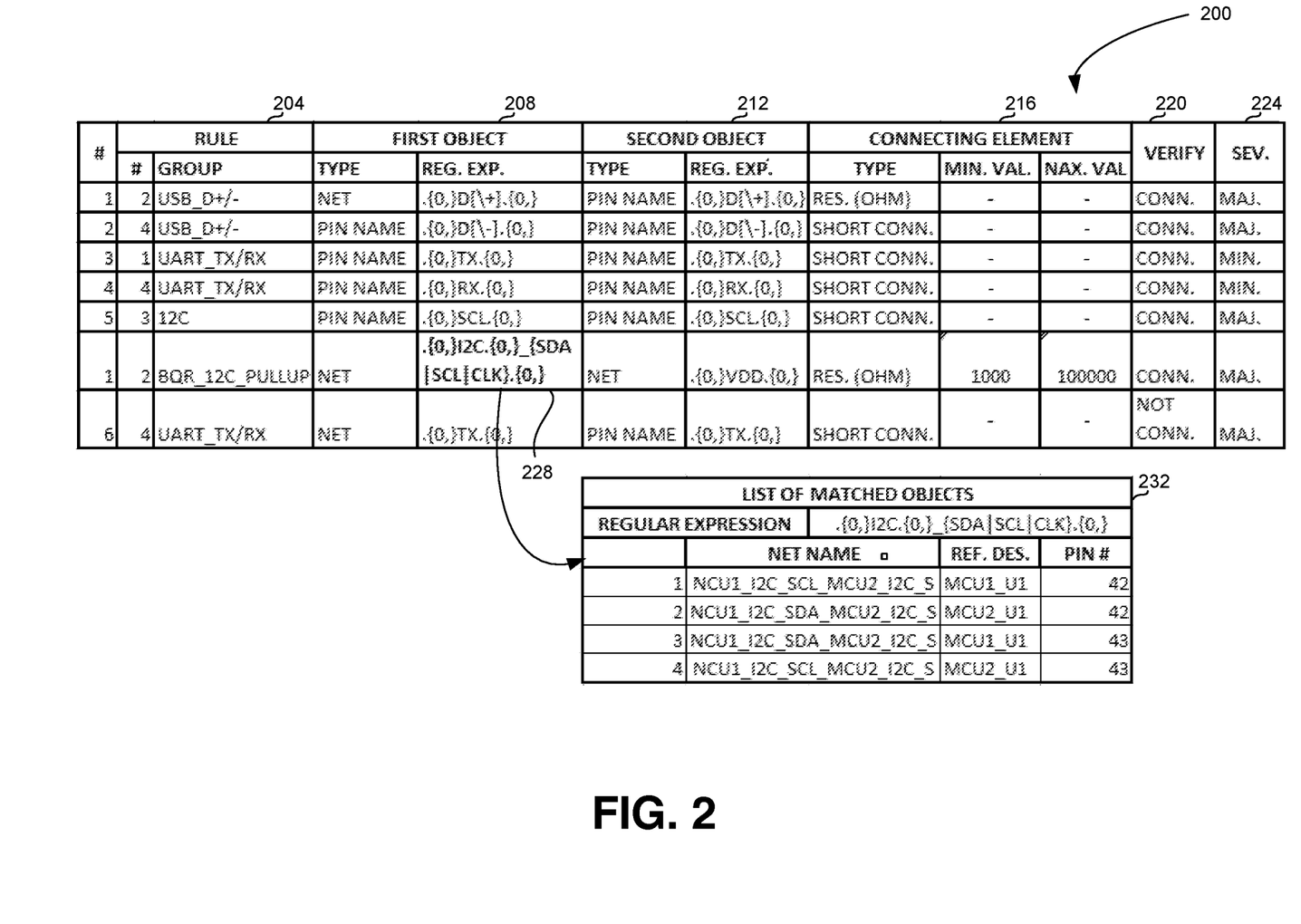
FIG. 2 shows an exemplary user interface for defining rules for verifying the connectivity of electronic circuit designs, in accordance with some exemplary embodiments of the disclosed subject matter.

Referring now to FIG. 2, showing a portion of a user interface for defining rules, in accordance with the disclosure.

The rule definition user interface comprises a main table 200, having a row for each defined rule, wherein a rule definition may later be parsed and a multiplicity of specific rules may be generated.

Each rule may be associated with a group and a serial number as shown in column 204. For each rule, the user may define the first Object on column 208, by providing a type and optionally a regular expression. The Object type may be "NetName", "PinType" or "PinName". The regular expression may also be a string indicating a unique Object. The user may define the second Object as shown on column 212, including a type and a regular expression.

In some embodiments, if the first Object is defined to be of Net type, the second Object may be defined as DifferNet, wherein the combination provides for testing connectivity between two Nets, with a regular difference in their names. Such connectivity rule may be used useful for differential signals, for example, "SGMII_SWP_GEPO_TX_N" on one side and "SGMII_SWP_GEPO_TAC_TX_N" on the other side, wherein the "TAC_" string is a regular difference. In this case, each instance complying with the regular expression of the first Object list is tested for connectivity with at least one instance complying with the regular expression of the second Object, wherein the names differ by the regular difference.

The user may then select a Connecting Element as shown on column 216, the Connecting Element connecting between the first Object and the second Object. The user may indicate a parameter or parameter range, for example a minimum value and maximum value, for the Connecting Element, unless the Connecting Element is of type "Short Connection" which has no parameters.

On column 220 the user may indicate the interaction between the first and the second Object, i.e., whether the rule needs to verify that the first Object is connected to the second Object or disconnected from it.

On column 224 the user may indicate the severity of failure of the corresponding rule.

It will be appreciated that the first Object, the second Object, the Connecting Element or any of their parameters, the interaction and the severity may be defined in any order and are not limited to the order detailed above.

In some embodiments of the disclosure, a user can select a regular expression associated with a first Object or with a second Object, and be presented with a list of the Objects matching the type and the regular expression, as shown on Table 232 displaying the Objects matching the regular expression of entry 228 of Table 200.

In some embodiments, a rule may not be only a standalone rule, but may also be part of one or more sequences, wherein the particular sequence and its end result depend on the results of intermediate tests. In chip manufacturing, sequences may be used for verifying specific implementations against the reference design of a chip. The chip manufacturers may use the Automatic Schematic Review (ASR) Chip Interconnection to automatically verify the specific implementation against their Reference Design. For example, the interconnection of two ICs may be the performed between groups of pins, and tested according to a sequence of rules. An example is the interconnection of an ASIC to a memory chip such as a DDR.

Figure 3A:
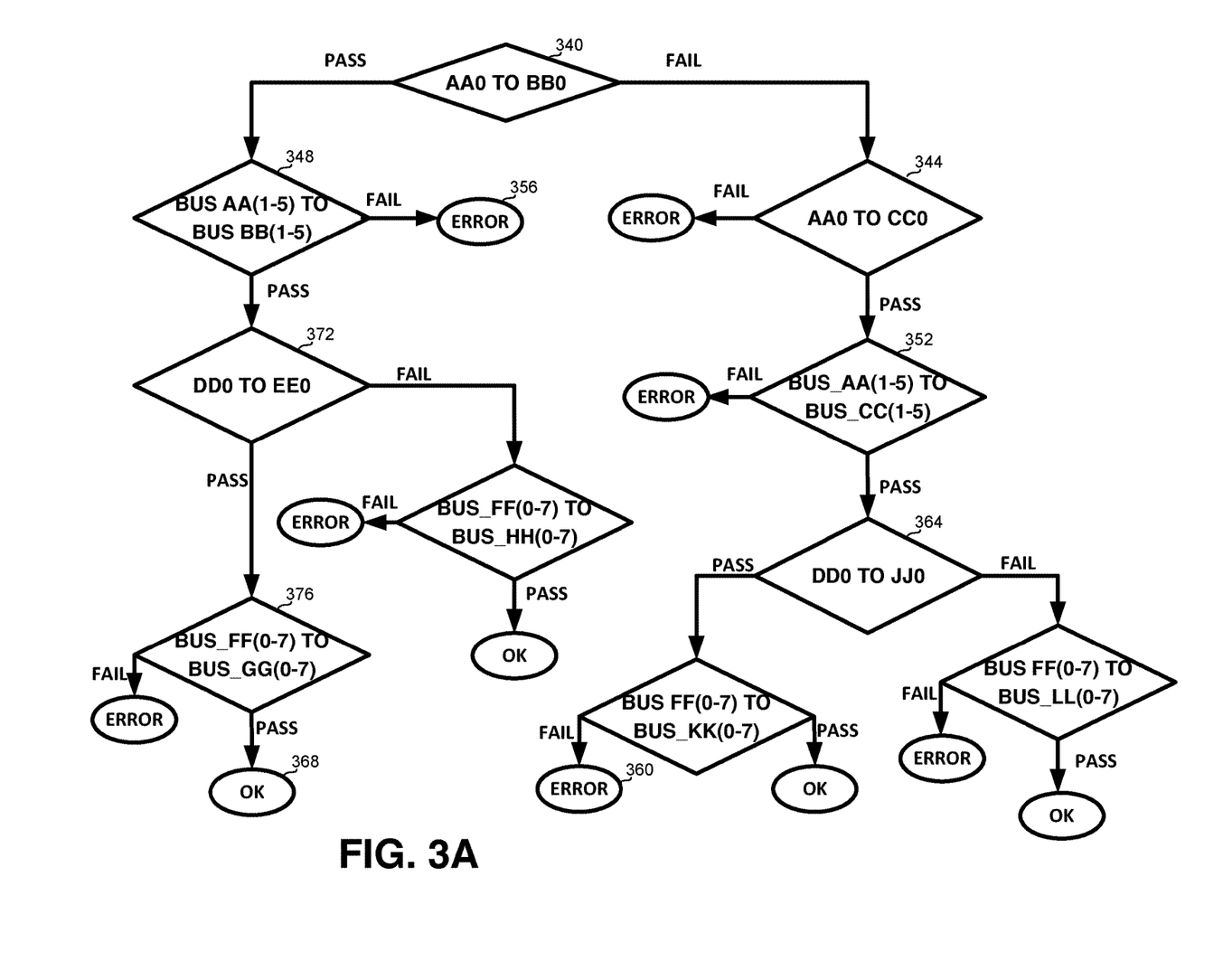
FIG. 3A shows a schematic illustration of a binary tree of rules, in accordance with some exemplary embodiments of the disclosed subject matter.

Referring now to FIG. 3A, showing an exemplary binary rule tree. In the binary tree of FIG. 3A, the first rule is AA0 to BB0 340. If AA0 to BB0 340 fails, the next rule would be AA0 to CC0 344, and if passes the next rule would be BUS AA(1-5) to BUS BB(1-5) 348. Then, if AA0 to CC0 344 fails, the sequence fails. And also if BUS AA(1-5) to BUS BB(1-5) 348 fails the sequence fails. If AA0 to CC0 344 fails the next rule would be BUS AA(1-5) to BUS BB(1-5) 352, and so on in accordance with the depicted tree.

Eventually, some of the tree leaves represent total failure of the sequence, such as: leaf 356 being the result of AA0 to BB0 340 pass and BUS AA(1-5) to BUS BB(1-5) 348 fail; or leaf 360 being the result of AA0 to BB0 340 fail, AA0 to CC0 340 pass, BUS AA(1-5) to BUS CC(1-5) 352 pass, DD0 to JJ0 364 pass and BUS FF(0-7) to BUS KK(0-7) fail. Other leaves represent success of the sequence, for example: leaf 368 being the result of AA0 to BB0 340 pass, BUS AA(1-5) to BUS BB(1-5) 348 pass, DD0 to EE0 372 pass and BUS FF(0-7) to BUS GG(0-7) 376 pass.

Figure 3B:
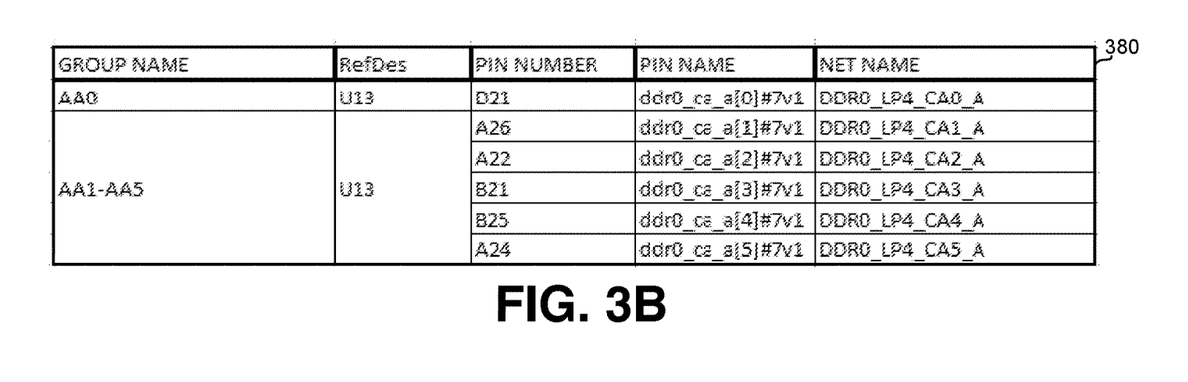
FIGS. 3B and 3C shows exemplary user interfaces for defining a binary tree of rules for verifying the connectivity of electronic circuit designs, in accordance with some exemplary embodiments of the disclosed subject matter.

FIG. 3B shows an exemplary user interface comprising table 380 for defining groups of pins. A group may comprise one or more pins, for example group AA0 comprises one pin, while group AA1-AA5 comprises five pins.

Figure 3C:
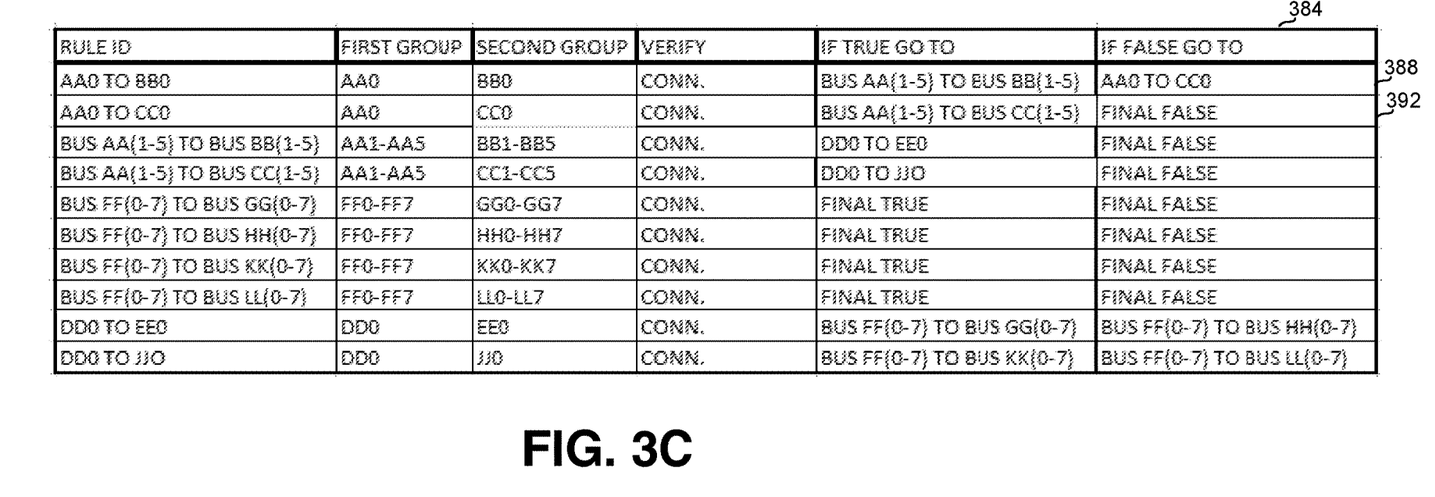

FIG. 3C shows an exemplary user interface defining the rule tree shown in FIG. 3A above. comprising table 384 for defining rules connecting first and second groups as defined for example by the user interface shown in FIG. 3B. For each such rule, a next rule or a final result is defined for a pass result and for a fail result. It will be appreciated that table 384 uses pin groups beyond those shown in FIG. 3B, and that table 380 of FIG. 3B has been cropped for simplicity. Thus, a first rule 388 is defined, identified as AA0 to BB0 and corresponding to node 340 of FIG. 3A. Rule 388 verifies connectivity between group AA0 and group BB0. If rule 388 passes, the next rule would be BUS AA(1-5) to BUS BB(1-5) corresponding to node 348, and if rule 388 fails the next rule would be AA0 to CC0 392. If AA0 to CC0 392 passes, the next rule would be BUS AA(1-5) to BUS BB(1-5), and if failed, the sequence ends with failure.

Figure 4:
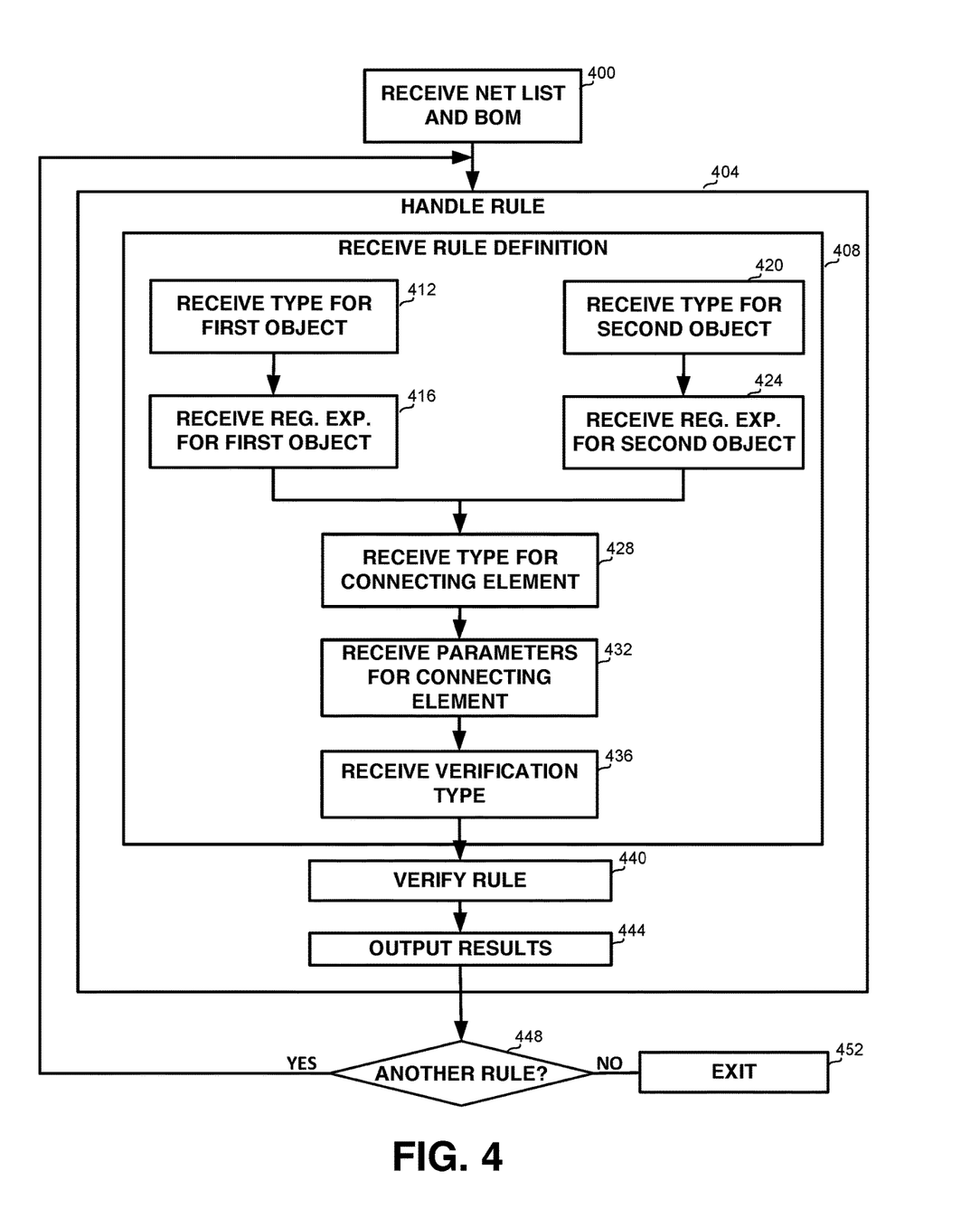
FIG. 4 shows a flowchart of a method of verifying connectivity of electronic circuit designs, in accordance with some exemplary embodiments of the disclosed subject matter.

Referring now to FIG. 4, showing a flowchart of a method for verifying connectivity of a circuit design.

On step 400, information about the design of an electronic circuit may be obtained, comprising a net list and bill of materials (BOM). The design specifies a plurality of connections between a plurality of components within at least a portion of the circuit design. The design may include additional data, for example parametric models of one or more components. The design may be received in any available format, such as but not limited to Intel® Schematic Checking Format (ISCF), OrCAD, Mentor, Altium, or others. The design may be received directly, over a communication channel, or the like.

On step 404, a single rule may be handled, which may include defining the rule, verifying the rule and outputting the verification results.

On step 408, a definition of a rule may be received from a user, for example via a user interface. The rule definition verifies an interaction between a first Object and a second Object, via a Connecting Element. It will be appreciated that the definitions may also be received via other means, such as a text file, a file of a proprietary format, or the like, which may be received directly, via computer communication, or the like. Step 408 may comprise the following steps:

On step 412, a type selection may be received for the first Object, for example NetName, PinType or PinName.

On step 416, a regular expression may be received for the first Object. The regular expression may correspond to zero, one or more Objects in the circuit. A user may perform an action such as clicking on a mouse button, to be presented with a list of objects in the circuit complying with the regular expression.

In an analogous manner, on steps 420 and 424, a type and optionally regular expression may be received for the second Object. The Object type may be NetName, PinType or PinName. Additionally, if the type of the first Object is NetName, then the type of the second Object may be a DifferNet.

On step 428, a type selection may be received for the Connecting Element, such as a Resistor, an Extern Resistor, an Intern Resistor, a Capacitor, an Extern Capacitor, an Intern Capacitor, a Coil or a Short Connection.

On step 432, relevant parameters for the Connecting Element may be received, such as minimal and/or maximal resistance/capacity/etc.

It will be appreciated that by entering a regular expression with which multiple Objects comply, in at least one defined rule the at least one first Object may comprise at least two components, or the at least one second Object may comprise at least two components. In some embodiments, the Connecting Element may comprise at least two Connecting Elements, such that if the first Object and the second Object are connected via at least one of the Connecting Element then the rule is verified.

On step 436 a verification type may be received for the rule, such as whether the expected result of the rule is connected or disconnected.

A severity degree for failure of the rule may also be received, such as none, minor, major and fatal. If, for example, there are failed rules, but all failed rules are minor, the design may still be acceptable.

It will be appreciated that all steps listed above may be performed in any order, for example the second Object may be selected before the first Object, the Connecting Element may be selected before the First or the second Object, or the like.

In some embodiments, specific rules may be generated upon the rule description. Thus, all regular expressions may be parsed into applicable names, and all relevant combinations are created, using the net list and the BOM. However, in some embodiments, the specific rule definitions may be obtained directly from the rule description, in which case the specific rule generation is performed implicitly as part of receiving the rule definition.

On step 440, the rule may be verified against the electronic circuit design, and checked whether it holds or not, and on step 444 the verification results may be output to a user in any required format, such as text, table, end result (pass/fail), or the like.

On step 448, it may be verified, for example by asking the user to indicate, whether another rule is to be verified and tested. If not, then the program may exit on step 452, otherwise execution may return step 404 for another rule.

In some embodiments, definitions of a multiplicity of rules may be received, followed by verification and result outputting of the multiplicity of rules, rather than verifying and outputting result for each rule separately. It will be appreciated that also rules for which the definitions were previously results and stored may be verified, with or without newly received rules.

In some embodiments, one or more rules may also be checked on actual circuits, and not only on the design.

Figure 5:
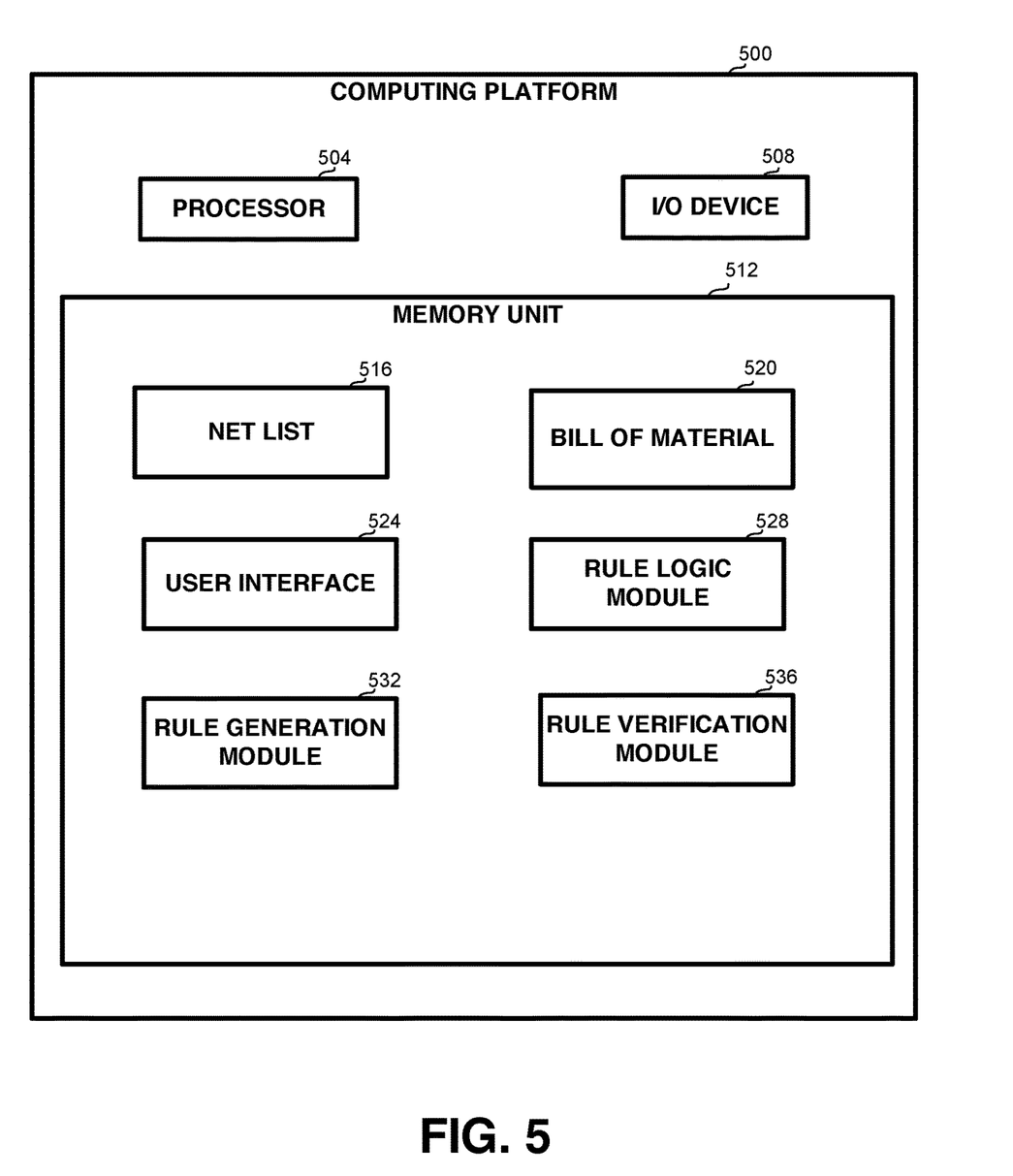
FIG. 5 shows a block diagram of a computing device configured for verifying connectivity of electronic circuit designs, in accordance with some exemplary embodiments of the disclosed subject matter.

Referring now to FIG. 5, showing a block diagram of a computing platform for verifying connectivity of a circuit design, in accordance with some exemplary embodiments of the disclosed subject matter.

In some exemplary embodiments computing platform 500 may comprise a processor 504, which may be a Central Processing Unit (CPU), a microprocessor, an electronic circuit, an Integrated Circuit (IC) or the like. Processor 504 may be utilized to perform computations required by computing platform 500 or any of its subcomponents. Processor 504 may be configured to execute computer-programs useful in performing the method of FIG. 4.

In some exemplary embodiments, one or more I/O devices 508 may be configured to receive input from and provide output to a user. In some exemplary embodiments, I/O devices 508 may be utilized to present to the user a user interface, and obtain user input instructions useful for defining the rules, and display the results of verifying the rules against the design. I/O devices 508 may comprise a keyboard, a mouse, a touch screen or another tracking device, a voice activated device, or the like.

In some exemplary embodiments computing platform 500 may comprise a memory unit 512. Memory unit 512 may be a short-term storage device or long-term storage device. Memory unit 512 may be a persistent storage or volatile storage. Memory unit 512 may be a disk drive, a Flash disk, a Random Access Memory (RAM), a memory chip, or the like. Memory unit 512 may be a single memory device, or multiple interconnected memory devices which may be co-located or located in different locations and communicating via any communication channel.

In some exemplary embodiments, memory unit 512 may retain program code operative to cause processor 504 to perform acts associated with any of the subcomponents of computing platform 500. In some exemplary embodiments, memory unit 512 may retain program code operative to cause processor 504 to perform acts associated with any of the steps shown in FIG. 4 above.

Memory unit 512 may retain Net List 516, and BOM 520 of an electronic circuit. Net List 516 and BOM 520 may be in any acceptable format.

The components detailed below may be implemented as one or more sets of interrelated computer instructions, executed for example by processor 504 or by another processor. The components may be arranged as one or more executable files, dynamic libraries, static libraries, methods, functions, services, or the like, programmed in any programming language and under any computing environment.

Memory unit 512 may retain user interface 524, designed for displaying to a user a user interface, such as the exemplary user interface shown on FIG. 2, 3B or 3C above, for defining one or more rules. User interface 524 may use any of I/O devices 408 for display. User interface 524 may also display to a user the results of verifying the rules, or additional data. User interface 524 may obtain data from Net List 516 and BOM 520.

Memory unit 512 may retain rule logic module 528, which may be called or otherwise used by user interface 524 for verifying that the rules are being defined logically, and the correct options are displayed to a user at each stage. For example, minimal and/or maximal capacity may be defined for a Connecting Element of type capacitor, DifferNet may be selected as a second Object only of the first Object is of type Net, or the like.

Memory unit 512 may retain rule generation module 532 for parsing the defined rules, obtaining elements complying with regular expressions, and generating specific rules from the defined rules.

Memory unit 512 may retain rule verification module 536, for verifying the specific rules generated by rule generation module 532 upon the specifications entered by a user using user interface 524, and obtaining a pass/fail indication for each such rules. The results may then be displayed to a user as part of user interface 524.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method, comprising
    obtaining circuit information of at least a portion of a circuit design, the circuit information specifying a plurality of components and a plurality of connecting elements connecting components from the plurality of components;
    receiving a plurality of rule definitions, each rule definition verifying an interaction between at least one first object and at least one second object, via at least one connecting element;
    obtaining a plurality of specific rules generated upon the plurality of the rule definitions, each specific rule verifying connectivity between a first instance of the at least one first object and a second instance of the at least one second object through the at least one connecting element;
    verifying each of the plurality of the specific rules against the circuit information, thereby checking that the first instance has the interaction with the at second instance via the at least one connecting element; and
    outputting results of verifying the specific rules.

2. The method of claim 1, wherein in at least one rule definition of the plurality of rule definitions the at least one first object comprises at least two alternative components from the plurality of components, or the at least one second object comprises at least two alternative components from the plurality of components, or the at least one connecting element comprises at least two alternative connecting elements from the plurality of connecting elements.

3. The method of claim 1, further comprising obtaining, by the computing device, model data associated with at least one component of the plurality of components or at least one connecting element of the plurality of connecting elements.

4. The method of claim 1, wherein the at least one first object or the at least one second object includes at least one electronic component pin or at least one network.

5. The method of claim 4, wherein each of the electric component pins is specified by at least one characteristic selected from the group consisting of: a pin name; a pin type; and a pin number.

6. The method of claim 1, wherein the at least one first object or the at least one second object or the at least one connecting element is defined by a common expression.

7. The method of claim 6, wherein the common expression is expressed as a regular expression.

8. The method of claim 1, wherein the interaction between the at least one first object and the at least one second object is selected from the group consisting of connected or not connected.

9. The method of claim 1, wherein the at least one connecting element comprises a plurality of connecting elements.

10. The method of claim 1, wherein the plurality of rule definitions comprises a sequence of rule definitions such that at least one rule based on second rue definition is to be performed subject to specific results of at least one preceding rule based on a first rule definitions, and an end result of the sequence of rules depends on results of the at least one rule and the of a least one preceding rule.

11. An apparatus having a processor, the processor being adapted to perform the steps of:
obtaining circuit information of at least a portion of a circuit design, the circuit information specifying a plurality of components and a plurality of connecting elements connecting components from the plurality of components;
receiving a plurality of rule definitions, each rule definition verifying an interaction between at least one first object and at least one second object, via at least one connecting element;
obtaining a plurality of specific rules generated upon the plurality of the rule definitions, each specific rule verifying connectivity between a first instance of the at least one first object and a second instance of the at least one second object through the at least one connecting element;
verifying each of the plurality of the specific rules against the circuit information, thereby checking that the first instance has the interaction with the second instance via the at least one connecting element; and
outputting results of verifying the specific rules.

12. The apparatus of claim 11, wherein in at least one rule definition of the plurality of rule definitions the at least one first object comprises at least two alternative components from the plurality of components, or the at least one second object comprises at least two alternative components from the plurality of components, or the at least one connecting element comprises at least two alternative connecting elements from the plurality of connecting elements.

13. The apparatus of claim 11, wherein the processor is further configured to obtain model data associated with at least one component of the plurality of components or at least one connecting element of the plurality of connecting elements.

14. The apparatus of claim 11, wherein the at least one first object or the at least one second object includes at least one electronic component pin or at least one network.

15. The apparatus of claim 14, wherein each of the electric component pins is specified by at least one characteristic selected from the group consisting of: a pin name; a pin type; and a pin number.

16. The apparatus of claim 11, wherein the at least one first object or the at least one second object or the at least one connecting element is defined by a common expression being a regular expression.

17. The apparatus of claim 11, wherein the interaction between the at least one first object and the at least one second object is selected from the group consisting of connected or not connected.

18. The apparatus of claim 11, wherein the at least one connecting element comprises a plurality of connecting elements.

19. The apparatus of claim 11, wherein the plurality of rule definitions comprises a sequence of rule definitions such that at least one rule based on a second rule definition is to be performed subject to specific results of at least one preceding rule based on a first rule definition, and an end result of the sequence of rules depends on results of the at least one rule and the of at least one preceding rule.

20. A computer program product comprising a non-transitory computer readable medium retaining program instructions, which instructions when read by a processor, cause the processor to perform a method comprising:
obtaining circuit information of at least a portion of a circuit design, the circuit information specifying a plurality of components and a plurality of connecting elements connecting components from the plurality of components;
receiving a plurality of rule definitions, each rule definition verifying an interaction between at least one first object and at least one second object, via at least one connecting element;
obtaining a plurality of specific rules generated upon the plurality of the rule definitions, each specific rule verifying connectivity between a first instance of the at least one first object and a second instance of the at least one second object through the at least one connecting element;
verifying each of the plurality of the specific rules against the circuit information, thereby checking that the first instance has the interaction with the second instance via the at least one connecting element; and
outputting results of verifying the specific rules.

* * * * *